(12) United States Patent
Sieg

(10) Patent No.: US 12,047,064 B2
(45) Date of Patent: Jul. 23, 2024

(54) ARRANGEMENT FOR A CAPACITIVE SENSOR DEVICE OF A VEHICLE

(71) Applicant: Huf Hülsbeck & Fürst GmbH & Co. KG, Velbert (DE)

(72) Inventor: Berthold Sieg, Bottrop (DE)

(73) Assignee: Huf Hülsbeck & Fürst GmbH & Co. KG, Velbert (DE)

( * ) Notice: Subject to any disclaimer, the term of this patent is extended or adjusted under 35 U.S.C. 154(b) by 981 days.

(21) Appl. No.: 16/981,601

(22) PCT Filed: Feb. 27, 2019

(86) PCT No.: PCT/EP2019/054822
§ 371 (c)(1),
(2) Date: Sep. 16, 2020

(87) PCT Pub. No.: WO2019/179727
PCT Pub. Date: Sep. 26, 2019

(65) Prior Publication Data
US 2021/0021262 A1    Jan. 21, 2021

(30) Foreign Application Priority Data
Mar. 21, 2018   (DE) .................... 10 2018 106 623.6

(51) Int. Cl.
*H03K 17/955*   (2006.01)
*B60R 16/03*    (2006.01)

(52) U.S. Cl.
CPC ........... *H03K 17/955* (2013.01); *B60R 16/03* (2013.01)

(58) Field of Classification Search
CPC ..... H03K 17/955; H03K 2217/960705; H03K 2217/960725; B60R 16/03
See application file for complete search history.

(56) References Cited

U.S. PATENT DOCUMENTS

2016/0187277 A1*   6/2016   Potyrailo ............. G01N 27/026
                                                          324/633
2017/0373686 A1   12/2017  Wendt et al.

FOREIGN PATENT DOCUMENTS

DE    102012102422 A1    9/2013
DE    102012105266 A1   12/2013
(Continued)

OTHER PUBLICATIONS

Office Action for European Application No. 19708094.8 mailed on Nov. 23, 2022, with its English summary, 10 pages.
(Continued)

*Primary Examiner* — Farhana A Hoque
(74) *Attorney, Agent, or Firm* — Bret E. Field; Bozicevic, Field & Francis LLP

(57) ABSTRACT

The invention relates to an arrangement (10) for a capacitive sensor device (20) of a vehicle (1), in particular for control and/or evaluation at the capacitive sensor device (20) for detecting an activating action at the vehicle (1), comprising
  at least one sensor electrode (20.1) for sensing a change in a vicinity of the vehicle (1),
  a transmission arrangement (30) for a frequency- and/or phase-dependent transmission of an electrical input signal (E) and an output of an output signal (A),
  an output (30.2) of the transmission arrangement (30), which is electrically connected to the sensor electrode (20.1) to output the output signal (A) at the sensor electrode (20.1) for performing the sensing,
  wherein the transmission arrangement (30) comprises a controlled source device (30.3) to output the output signal (A) as a guided electrical signal at the sensor electrode (20.1) depending on the frequency- and/or phase-dependent transmission of the input signal (E).

16 Claims, 6 Drawing Sheets

(56) References Cited

FOREIGN PATENT DOCUMENTS

Figure 1:
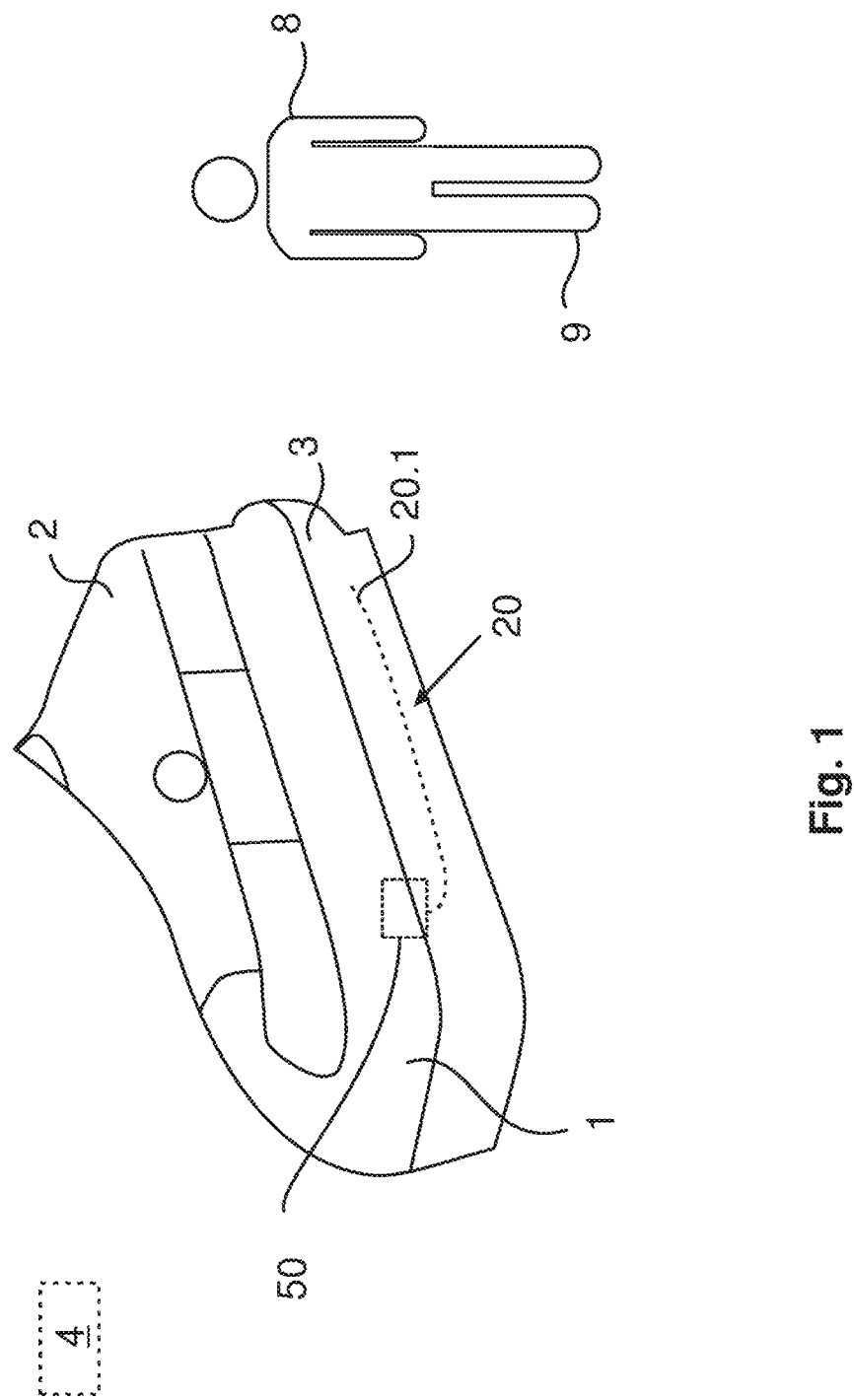

DE    102012224037 A1   6/2014
WO    WO2016107910 A1   7/2016

OTHER PUBLICATIONS

Keim, How to Low-Pass Filter a Square Wave, Mar. 7, 2018, pp. 1-9, Retrieved from the Internet: https://www.allaboutcircuits.com/technical-articles/how-to-low-pass-filter-a-square-wave/ [retrieved on May 8, 2019].
Baxter, Carrier, In: Capacitive Sensors: Design and Applications, Wiley-IEEE Press, pp. 171-173, Jan. 1, 1997.

* cited by examiner

ARRANGEMENT FOR A CAPACITIVE SENSOR DEVICE OF A VEHICLE

The present invention relates to an arrangement for a capacitive sensor device of a vehicle. Furthermore, the invention relates to a sensor device, an external door handle and a method for operating a capacitive sensor device of a vehicle.

It is known from the prior art that a capacitive sensor device with a sensor element can be used on a vehicle to detect changes in the vicinity of the sensor element, such as a movement or an approach of a person. For evaluation of the sensor element, it can be repeatedly charged and discharged, which accordingly involves the output and reception of electrical signals within the sensor device. For this purpose, periodic square wave signals are usually used, which can occur due to recharging and/or switching between a discharging and a charging current path.

For the evaluation of the sensor element, recharging methods are known, for example, as disclosed in DE 10 2012 102 422 A1, DE 10 2012 105 266 A1, DE 10 2013 112 909 A1 or DE 10 2013 112 910 A1.

A common problem is that such a signal for evaluation, and in particular a square wave signal, can have a spectrum with unfavourable frequencies. It is therefore conceivable that during recharging by means of the signal at the sensor element, a disturbing radiation may occur. Accordingly, it is often a technical challenge and associated with costly measures to reduce the disturbing effects of the sensor device on the environment. For example, problems can arise due to interactions with radio signals in the range of 510 kHz to 1.71 MHz. Such radio signals are emitted in particular by external transmitters of medium wave broadcasting (in the AM band) or the like. The measures to reduce and/or compensate for these interactions are often technically complex and cost-intensive.

It is therefore an object of the present invention to at least partially eliminate the disadvantages described above. In particular, it is an object of the present invention to enable an improved operation of a capacitive sensor device of a vehicle.

The preceding object is solved by an arrangement with the features of the independent device claim, a sensor device with the features of the parallel device claim, an external door handle with the features of the further parallel device claim and a method with the features of the independent method claim. Further features and details of the invention result from the respective dependent claims, the description and the figures. Features and details which are described in reference to the arrangement according to the invention are of course also valid in reference to the sensor device according to the invention, the external door handle according to the invention as well as the method according to the invention, and vice versa, so that with regard to the disclosure of the individual aspects of the invention reference is or can always be made to each other.

The object is solved in particular by an arrangement, in particular an electrical circuit arrangement, for a capacitive sensor device of a vehicle, preferably for control and/or evaluation at the capacitive sensor device for detecting an activating action at the vehicle (e.g. in the front and/or side and/or rear region of the vehicle). The activating action can be performed by a person in the vicinity of the vehicle, for example. The person may wish to open a tailgate of the vehicle by a gesture at the rear region of the vehicle. This gesture is e.g. moving a body part underneath a bumper, which can be detected by the sensor device. A gesture in the vicinity of a door handle of the vehicle may also be provided as an activating action, e.g. to unlock and/or open a vehicle door.

Advantageously, the arrangement according to the invention comprises at least one of the following components:

at least one or exactly one sensor element, in particular in the form of a sensor electrode, for sensing a change in a vicinity of the vehicle, in particular in a vicinity of the sensor element, preferably in a region outside the vehicle and/or below a bumper and/or in the region of a door handle, preferably for sensing the gesture and/or the activating action, a transmission arrangement for a frequency-dependent and/or phase-dependent transmission, preferably for a frequency- and/or phase-dependent change, of an electrical input signal, in particular a control signal, and an output of an (electrical) output signal, which is preferably dependent on the (frequency- and/or phase-dependently transmitted/changed) input signal, and is preferably designed as a forcibly actuated sensor voltage and/or as a forcibly actuated sensor current, an output of the transmission arrangement, which is electrically connected directly or indirectly to the sensor element or sensor electrode to output the output signal at the sensor element or sensor electrode, an input of the transmission device where the input signal is provided.

In particular, it is provided that the transmission arrangement comprises a controlled source device to generate the output signal depending on the frequency-dependent and/or phase-dependent transmission, preferably frequency- and/or phase-dependent change of the input signal (i.e. in particular controlled by the transmitted/changed input signal), and preferably to output it as a guided electrical signal at the sensor electrode. This has the advantage that the spectrum of the input signal can be adapted by the transmission arrangement, i.e. e.g. (unwanted) interfering frequencies of the input signal can be filtered out and/or can be avoided when the output signal is output at the sensor electrode. In addition, however, it can also be ensured particularly reliably by using the source device that the signal applied to the sensor electrode continues to exhibit (essentially, e.g. within a specified tolerance) the spectrum adapted by the transmission arrangement. The solution according to the invention is based in particular on the consideration that the use of a square wave signal as an output signal for the sensor electrode is particularly problematic with regard to possible interference frequencies, and furthermore, in particular, passive filtering of the input signal is not sufficient, since interference frequencies may occur during the transmission of the output signal to the sensor electrode. In particular, it cannot otherwise be adequately ensured that the transmission of the output signal and/or the output at the sensor electrode do not have any disturbing effects on the output signal and/or an electromagnetic radiation at the sensor electrode. Therefore, a particular advantage is achieved by using a controlled source device to provide a guided signal at the sensor electrode. In particular, interference-reduced output of the output signal is favoured by the fact that the active generation of the output signal can cause the signal to be guided at the sensor electrode, which means that the problem of radiated interference frequencies when the signal is output at the sensor electrode can be met with particular reliability.

Advantageously, in the arrangement according to the invention, only a single (structurally designed) sensor electrode can be provided for the formation of a (variable) sensor capacitance, wherein preferably the counter-electrode for the formation of the sensor capacitance is formed by a mass of the vehicle and is therefore not regarded as a separate (dedicated) component. Preferably, parasitic capacitances of the sensor device are neglected. This enables a particularly simple design.

The sensor electrode can be a sensor element of an electrically conductive material. For example, the sensor electrode is designed as an oblong (elongated) electrical conductor, e.g. as an electrical cable, and optionally only connected to the vehicle electronic system via a single direct electrical connection.

An electrical connection can be either a direct or an indirect connection, i.e. also via other electrical components, but preferably only if the connection is exclusively electrical. For example, the electrical field between the sensor electrode and the vehicle mass cannot be regarded as a direct electrical connection, so that the sensor electrode preferably only comprises a single direct electrical connection to the vehicle electronic system. If necessary, the vehicle electronic system can also be understood as at least the sensor device and/or the monitoring device and/or the transmission arrangement.

The vehicle is preferably a motor vehicle, preferably a passenger car, and/or an electric vehicle and/or a hybrid vehicle and/or an autonomous vehicle.

It is also conceivable that the at least one sensor element, preferably the at least one sensor electrode, is arranged in a front and/or side and/or rear region of the vehicle, in particular in order to sense the change in the vicinity and/or the activating action correspondingly in said vicinity region, i.e. front and/or side and/or rear region of the vehicle. In this way, the activating action in this vicinity region can be reliably detected by the sensor device. For example, the detection can be used to intuitively move or activate elements and/or functions of the vehicle in this vicinity region. Such functions are e.g. lighting of the vehicle and/or unlocking of a locking device of the vehicle and/or similar. The elements can be, for example, a tailgate and/or side door and/or sliding door and/or bonnet, which are moved and/or opened and/or closed on the basis of the detection. It is also optionally possible that the sensor element is arranged on and/or inside or in the region of a door sill(s) in order to open e.g. a side door or sliding door of the vehicle on the basis of the detection. In order to reliably sense a movement and/or a movement pattern by means of the detection, at least two sensor elements, preferably sensor electrodes, may be provided as an alternative or in addition to the above-mentioned features. These are for example arranged together in at least one of the aforementioned vicinity regions, e.g. together in a bumper or door sill or door handle or similar.

A controlled source device, in particular a current and/or voltage source device, may be understood to be a real electrical component or an electrical circuit which comprise(s) approximately the function of an ideal controlled source (engl.: also known as a "dependent source"), in particular a current and/or voltage source. Thus, the source device can be understood as a real controlled source, in particular a real current source or a real voltage source (CVS, engl. "controlled voltage source"). An example of such a source device is an operational amplifier (OP), in particular a controlled, preferably voltage controlled, operational amplifier. It is particularly advantageous if the source device is designed as a (real) low impedance controlled (voltage) source. The source device can, for example, be designed with low impedance by designing the internal resistance (output resistance) and/or the input resistance of the source device with low impedance, preferably below 1 kOhm or below 500 Ohm or below or equal to 100 Ohm, respectively, wherein the internal resistance and the input resistance can also comprise different values. This significantly reduces the feedback effect of the downstream circuit on the source device, so that the properties of the output signal and in particular of the signal applied to the sensor electrode can be determined very precisely. In other words, the output signal can be output as a guided signal, i.e. in particular, the signal can be actively generated by the source device and/or the signal curve at the sensor electrode can be actively monitored (i.e. controlled or regulated). The source device is advantageously designed to provide a coupling between the control input and the output of the source device that is as free of feedback as possible. In the case of the source device, the signal (e.g. current or voltage) at the output of the source device can be controlled in particular by a control signal (control current or voltage) at the control input of the source device. This additional step and effort for the integration of the source device can be accepted according to the invention in order to achieve the advantage of an improved and reliably signal output to be monitored at the sensor electrode by a comparatively simple circuit engineering measure.

It is also advantageous if the source device is designed as a real low impedance controlled current and/or voltage source, preferably to output the generated output signal as a guided electrical signal at the sensor electrode. This has the advantage that influences which occur between the transmission arrangement and the sensor electrode can only have a reduced influence on the signal.

In a further possibility it can be provided that the source device is designed as an active component, preferably as an operational amplifier, wherein preferably the source device is connected (in particular directly) to a (own) supply voltage in order to preferably actively generate the output signal, and particularly preferably actively apply the output signal to the sensor electrode by the output. In other words, the output of the output signal can be realized by the source device in order to apply the output signal to the sensor electrode, wherein the output signal is actively generated by means of the supply voltage. In this way, deviations in the signal form of the applied signal can be reduced.

Furthermore, in the case of the arrangement according to the invention, it may be possible that the arrangement and/or the transmission arrangement and/or the filter components are dimensioned in such a way that a harmonic suppression of at least (−) 20 dB, in particular (−) 30 dB, preferably starting from a second or third harmonic occurs. In other words, an attenuation can be achieved starting from the second or third harmonic, wherein the signal is attenuated starting from the second or third harmonic (e.g. with at least 20 dB). As a result, the output signal is attenuated by at least 20 dB compared to the input signal for the frequency corresponding to the second or third harmonic.

It may preferably be provided that the transmission arrangement comprises at least one filter component to form an electronic filter, preferably an all-pass and/or low-pass and/or band-pass filter, to perform the frequency-dependent and/or phase-dependent transmission, preferably the frequency- and/or phase-dependent change, of the input signal. This provides a simple measure to suppress interfering frequencies. Preferably, the source device may be connected to at least one of these at least one filter component, so that an active filter, preferably a Sallen Key filter, is formed. For example, the active filter can be created by using an operational amplifier as the source device. This is particularly useful for guiding the signal.

Furthermore, it may be provided within the scope of the invention that the transmission arrangement comprises a first filter component, in particular for forming an RC low-pass filter, preferably of first filter order, and/or a second filter component, in particular for forming a Sallen Key filter, preferably of second filter order. Optionally, the filter components can be connected to one another in order to jointly perform the frequency-dependent and/or phase-dependent transmission, preferably the frequency- and/or phase-dependent change of the input signal and/or to increase the filter order of the transmission arrangement. It is also conceivable that further filter components are provided and connected, e.g. to further increase the filter order of the transmission arrangement. In particular, the filter components may only comprise passive components in order to reduce costs and/or design effort.

In accordance with a further advantage, it may be provided that the output signal can be generated depending on the frequency-dependent and/or phase-dependent transmission, preferably the frequency- and/or phase-dependent change, of the input signal by the fact that the source device is connected to at least one filter component, so that preferably the input signal, transmitted or changed by the filter component, is applied to a control input of the source device in order to control the source device with regard to the output of the output signal, and preferably an output of the source device is connected to or corresponds to the output of the transmission arrangement. In other words, the transmission arrangement may comprise two regions: an input region with the at least one filter component through which the input signal is transmitted or changed (i.e. filtered) depending on frequency and/or phase. And an output region with the source device, which can directly provide the output signal at the output of the transmission arrangement and is connected in particular to the filter component via a control input. This has the advantage that the output signal can be generated by the source device as a guided signal controlled by the input signal.

In a further possibility it may be provided that an input signal source is connected to an input of the transmission arrangement (e.g. electrically or optically and/or galvanically isolated) in order to preferably provide the input signal at the input, wherein the input signal source preferably comprises at least one control device for this purpose, in particular with a digital-analogue converter and/or a microcontroller. For example, a software of the microcontroller can directly generate the input signal (and e.g. output a digital-analogue converter), and thus, if necessary, also perform further signal forming on the input signal. It is also conceivable that the control device is designed to control an electronic switching element or the like in order to generate the input signal as a square wave signal. This allows a simple signal generation for the evaluation of the sensor electrode.

Another possibility may be that the transmission arrangement is designed to perform a suppression of harmonics of the input signal in order to preferably at least reduce an emission of signals in a disturbing frequency range by the sensor electrode. The emission is understood to mean in particular the emission of electromagnetic waves by the sensor electrode, which occurs depending on the output signal. In other words, the frequency-dependent and/or phase-dependent transmission, preferably the frequency- and/or phase-dependent change, can influence the frequency range from which the emission occurs through the transmission arrangement. This enables the control of the emission in order to reliably comply with thresholds, for example.

Optionally, it is conceivable that the source device is electrically connected to the vehicle electronic system, in particular to a monitoring device, in order to preferably perform a switch-off of the source device, so that the arrangement can be transferred to an energy-saving mode. This switch-off can be triggered, for example, by the fact that a certain period of time with an inactivity has elapsed (e.g. no activating action occurred). The advantage of using the source device is that it can be easily switched off, thus helping to reduce energy consumption.

Furthermore, it is conceivable that an input signal source is designed to provide the input signal in such a way that the input signal is designed as a signal based on a square wave signal which is actively changed, in particular by signal forming, e.g. by a looping of the edges of the square wave signal and/or by an amplitude which varies over time, in order to preferably support the frequency- and/or phase-dependent transmission and/or change, preferably a harmonic suppression, by the transmission arrangement. In other words, signal forming is performed before the frequency- and/or phase-dependent transmission and/or change by the transmission arrangement in order to improve the change by the transmission arrangement. It has proved to be particularly advantageous here that the input signal is generated by means of signal forming with a step form, and this is combined with a "looping" in the sense of an amplitude that varies over time. This type of signal forming should be simply called "sinusoidal step form". On the basis of an input signal formed in this way, the transmission arrangement can generate an output signal as sinusoidal as possible with a high degree of reliability, which thus comprises a narrow frequency bandwidth and correspondingly only low interference frequencies outside the operating frequency.

In particular, looping is understood to mean that, for example, a change in amplitude over time is caused by a low-pass or corresponding operation of the control device and/or a digital-analogue converter and/or the like and/or the edge steepness of the input signal is reduced.

It is preferably intended that the frequency- and/or phase-dependent transmission and/or change is a harmonic suppression, especially from a second or third harmonic of the input signal. Alternatively or additionally, it may be possible that the frequency- and/or phase-dependent transmission and/or change is designed as a transmission in the sense of an all-pass filter, i.e. with an (essentially) constant magnitude frequency response for all (essential) frequencies of the input signal, while the phase shift may depend on the frequency. The transmission arrangement can also provide the output signal e.g. as a square wave signal or the like. It is also conceivable that the transmission arrangement is designed as an electrical line or the like, and thus transmits the input signal (with regard to the signal form) essentially unchanged and outputs it as an output signal, e.g. as a signal based on a square wave signal.

Correspondingly, the frequency- and/or phase-dependent transmission and/or change can have a constant magnitude frequency response and/or phase response. Alternatively, the transmission arrangement may also have a non-constant magnitude frequency response and/or phase response. The provision of the output signal as a sinusoidal signal is particularly advantageous here, which is possible, for example, through a frequency-dependent change of the input signal in the sense of low-pass and/or band-pass filtering, especially for the suppression of harmonics.

When using a square wave signal on the one hand and a sinusoidal signal as an output signal on the other hand—and also for other desired signal types—the use of the controlled source device can offer significant advantages. It can be ensured that the output signal always comprises the desired signal form at the sensor electrode. Therefore, the arrangement according to the invention can basically be used for all conceivable signal types or signal forms of the input and/or output signal and is herein protected.

A further possibility may be that a monitoring device is provided, which is electrically connected to the sensor electrode, in order to preferably evaluate the sensing of the change in the vicinity of the vehicle by the at least one sensor electrode by evaluating a variable capacitance of the sensor device by the monitoring device by means of the output signal, wherein preferably the variable capacitance is dependent on the sensor electrode and the vicinity, wherein particularly preferably the electrical connection is designed in such a way that a recharging of an electrical charge of the sensor electrode to the monitoring device can be performed in order to determine the variable capacitance. For this purpose, the output signal can, for example, be used to charge the variable capacitance in a transmission phase, and preferably in a recharging phase a holding arrangement can be charged depending on the variable capacitance. By evaluating the change in the capacitance of the sensor device based on the charging of the holding arrangement, the activating action can then be detected by the monitoring device if necessary.

According to a further possibility, a monitoring device may be provided in order to evaluate the sensing of the change in the vicinity of the vehicle by the at least one sensor electrode by charging a holding arrangement of the monitoring device depending on a variable capacitance of the sensor device in repeatedly performed recharging phases, so that preferably in the recharging phases a charge accumulation takes place at the holding arrangement, wherein for this purpose in particular the sensor electrode is electrically connected to the holding arrangement in each recharging phase. Preferably, the input signal can also be generated and/or formed by the monitoring device and provided for the transmission arrangement at the input.

Furthermore, it is conceivable that an electronic switching element is provided, which is controlled by the monitoring device in such a way that the switching element repeatedly and alternately connects the at least one sensor electrode to a receive path and a transmit path. Thus, the receive path can lead to a holding arrangement to perform a recharging phase and the transmit path can lead to the transmission arrangement to perform a transmission phase.

Furthermore, it may be provided within the scope of the invention that the arrangement is adapted for integration into a door handle of the vehicle and/or into a rear region and/or side region and/or front region of the vehicle and/or into a bumper (buffer) of the vehicle, in particular wherein the sensor electrode comprises an elongated extension which is adapted to the length of the door handle and/or the bumper and/or to an extension of the vehicle rear in the transverse direction of the vehicle. It may be possible that the sensor electrode is designed as an electrical line with a length which corresponds to at least 50% or at least 80% of the length of the door handle or bumper. This enables a particularly extended sensing region. At least one sensor electrode in the bumper can serve as a so-called kick sensor, so that the present invention is also directed towards a kick sensor with the sensor device according to the invention. Furthermore, it is also conceivable that the sensor electrode comprises an extension deviating from an elongated extension, e.g. essentially a circular form or a rectangular form or a dot form or the like.

Furthermore, within the scope of the invention it is conceivable that the transmission arrangement and/or the source device is connected to the sensor electrode in such a way that an electrical signal and/or a signal form of the signal directly at the sensor electrode corresponds at least to 80% of the output signal and/or the signal form of the output signal, preferably wherein the output signal can be directly output at the source device. This ensures that the interfering frequencies are reliably reduced.

An object of the invention is also a sensor device for a vehicle, comprising
 an arrangement, in particular an arrangement according to the invention,
 a monitoring device electrically connected to the arrangement to provide an input signal for evaluating a variable capacitance of the sensor device for the arrangement. It is provided that the monitoring device can be electrically connected to a vehicle electronic system in order to activate a vehicle function (such as an authentication e.g. with an identification transmitter and/or unlocking and/or opening a tailgate and/or a door of the vehicle) depending on the evaluation. For example, if an activating action is detected as positive, an authentication can be initiated in order to cause the opening and/or unlocking in case of positive authentication. Thus, the sensor device according to the invention brings the same advantages as those described in detail with regard to an arrangement according to the invention.

Also protected is an external door handle for a vehicle with an arrangement according to the invention.

Also an object of the invention is a method for operating a capacitive sensor device of a vehicle, in particular for control and/or evaluation in the capacitive sensor device for detecting an activating action in the vehicle, e.g. in the front and/or side and/or rear region of the vehicle.

It is advantageous in a method according to the invention that at least one of the following steps can be performed, wherein the steps are preferably performed one after the other in the given order or in any order, and if necessary individual steps can also be repeated:
a) generating an electrical input signal,
b) performing a frequency- and/or phase-dependent transmission and/or change of the electrical input signal,
c) outputting an output signal in such a way that a guided electrical signal is output at the sensor electrode depending on the frequency- and/or phase-dependent transmission and/or change of the input signal, in particular wherein a source device is controlled depending on the transmitted and/or changed electrical input signal, and the output signal is generated and/or outputted at the sensor electrode depending on the control.

Thus, the inventive method enables the same advantages as those described in detail with respect to an inventive arrangement. In addition, the method may be suitable for operating an inventive arrangement.

Figure 2:
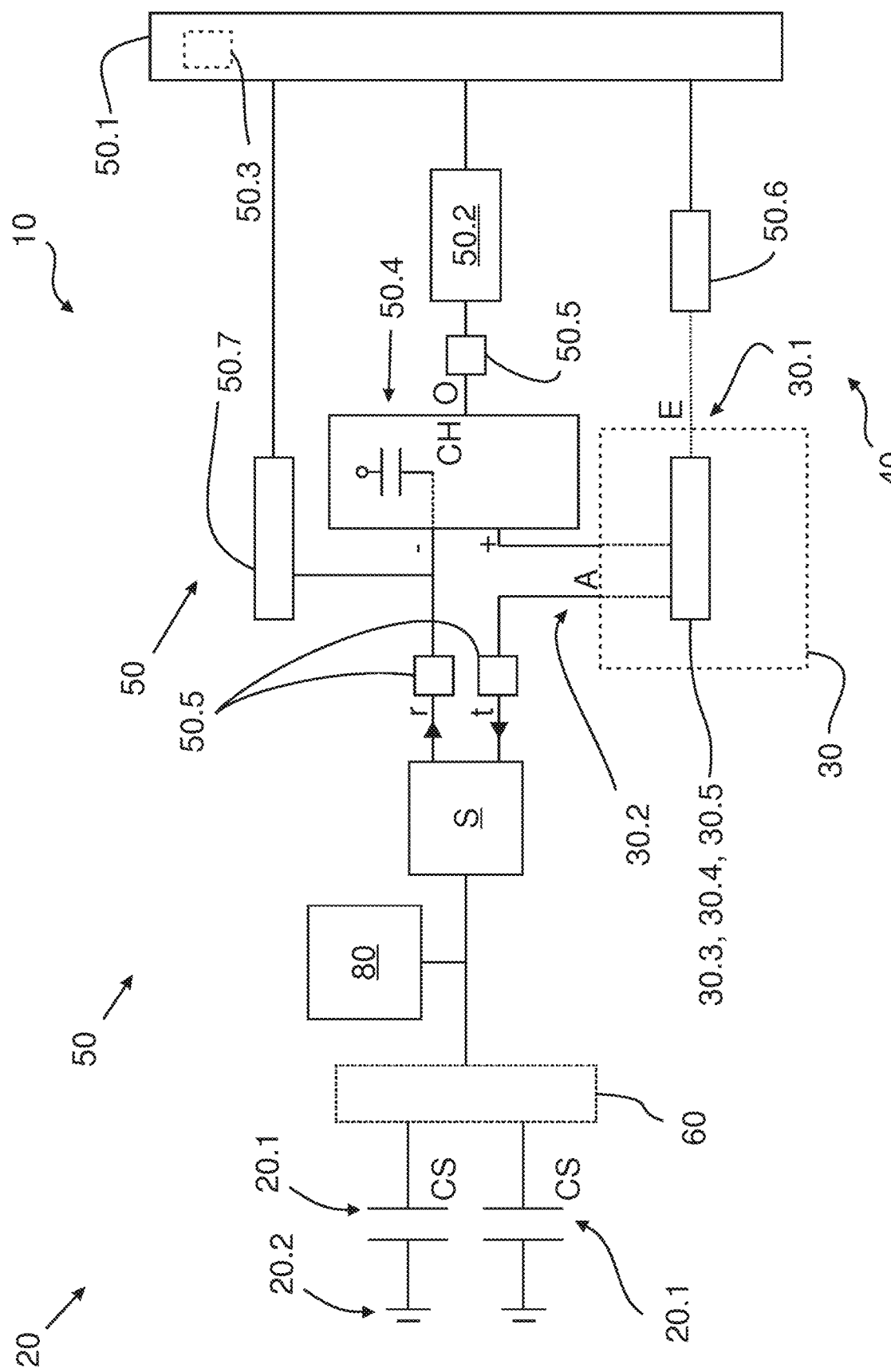
Figure 3:
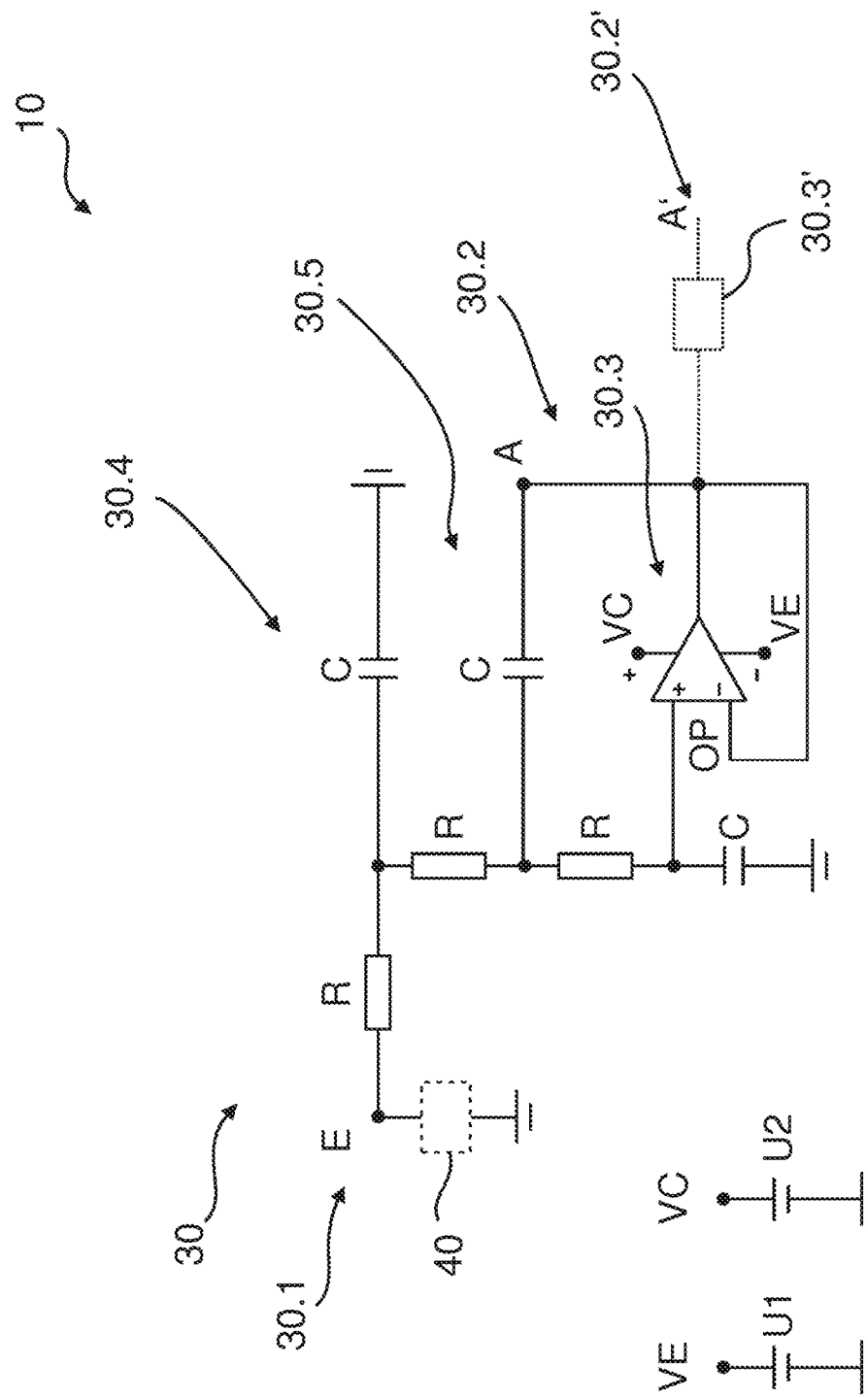
Figure 4:
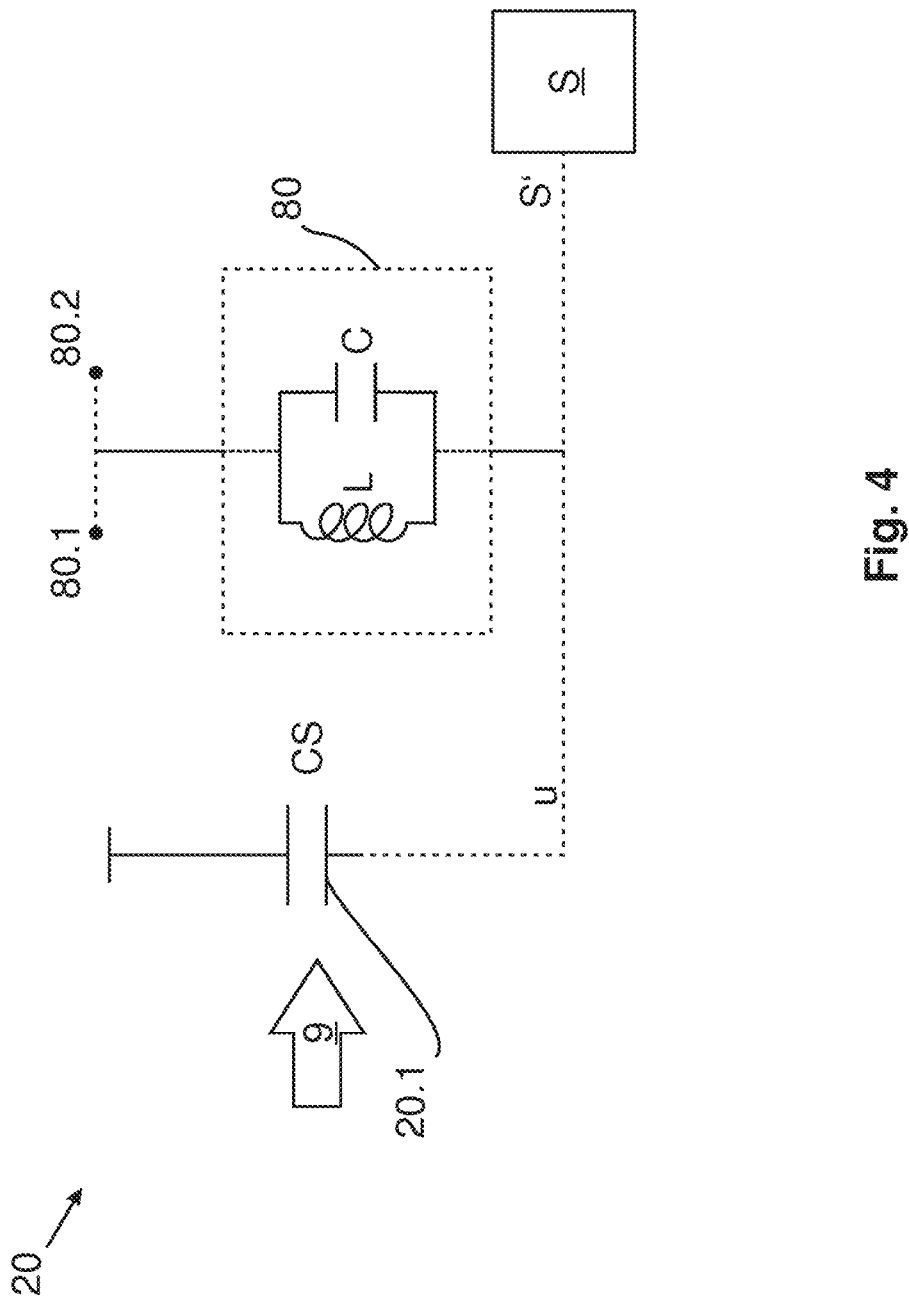
Figure 5:
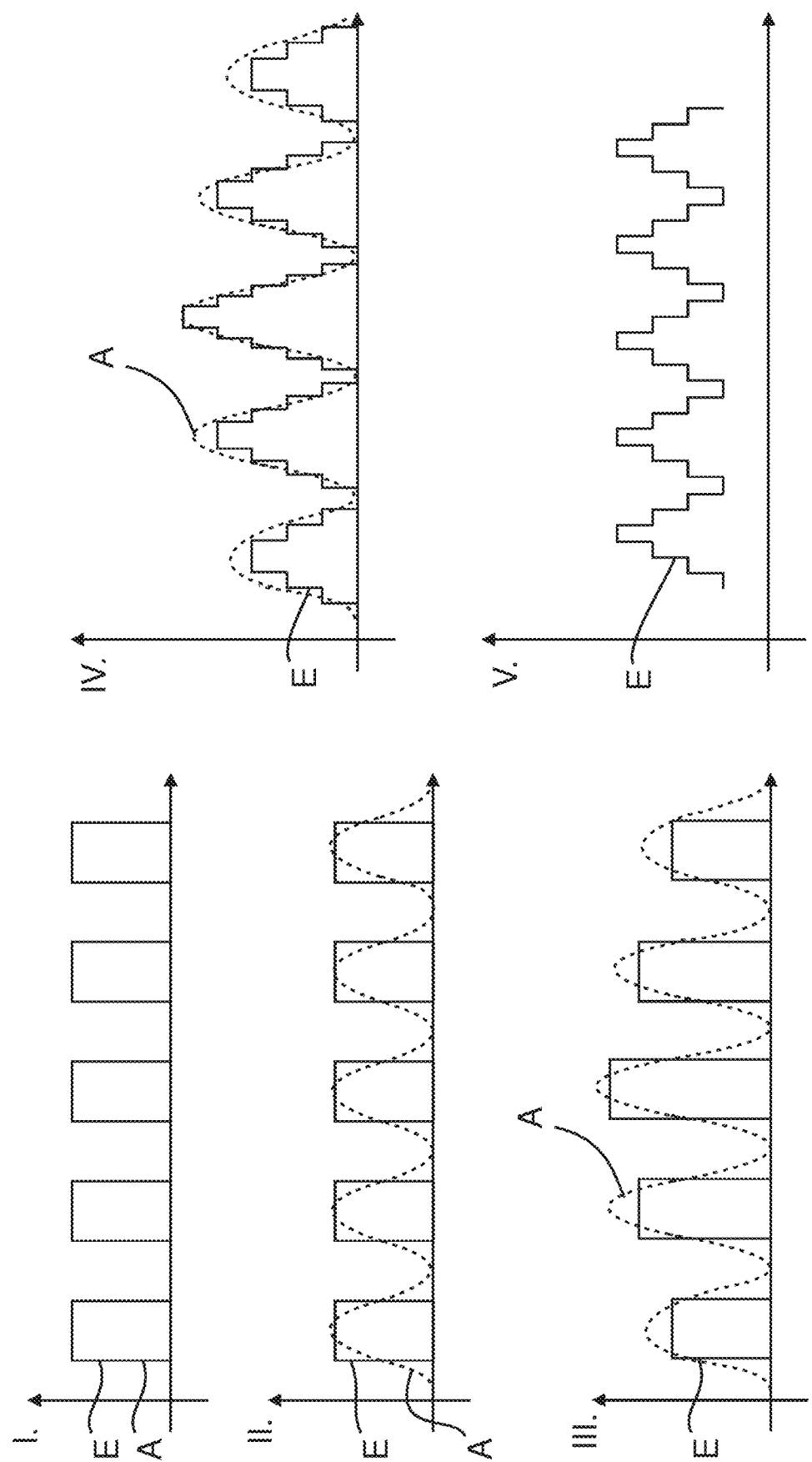
Figure 6:
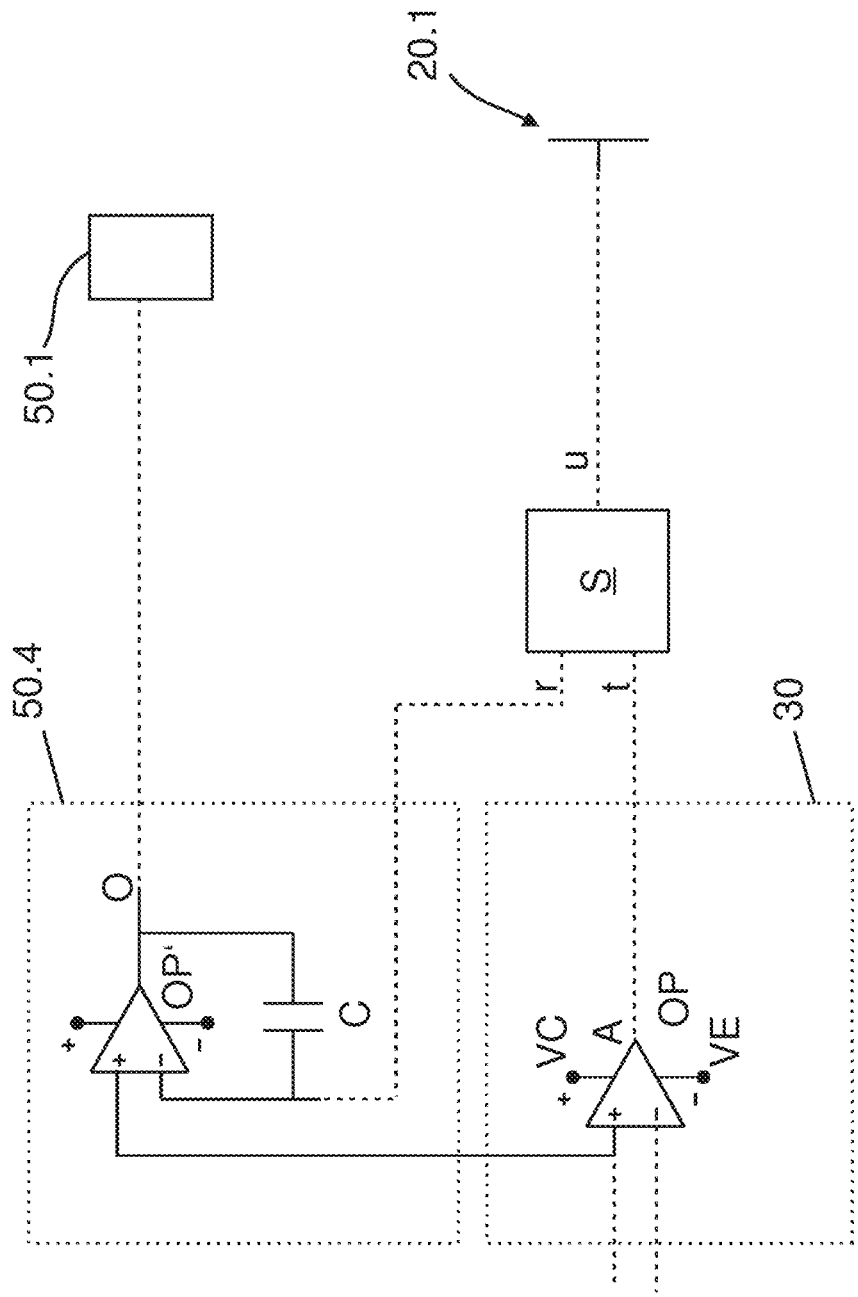

Further advantages, features and details of the invention are given in the following description, in which, with reference to the figures, embodiments of the invention are described in detail. The features mentioned in the claims and in the description can be individually essential for the invention or in any combination. The figures show:

FIG. 1 a perspective representation of a rear of a vehicle with a user,

FIG. 2 a schematic principle circuit diagram of a sensor device,

FIG. 3 a schematic representation of an arrangement according to the invention, FIG. 4 a schematic representation of a sensor device, FIG. 5 schematic representations of signal curves, FIG. 6 a further schematic representation of an arrangement according to the invention.

In the following figures, identical reference signs are used for the same technical features even from different embodiments.

FIG. 1 schematically shows a perspective representation of a vehicle 1. A tailgate 2 is shown above a bumper 3 of the vehicle 1, wherein the tailgate 2 can be opened according to a (first) vehicle function and/or closed again according to a (second) vehicle function. At least one sensor element 20.1, in particular a sensor electrode 20.1 of a capacitive sensor device 20, can be integrated into the bumper 3. Alternatively or additionally, the at least one sensor element 20.1 can also be integrated into an (external) door handle 4 of the vehicle 1 or another vehicle component. The capacitive sensor device 20 accordingly comprises a capacitive sensor which is at least partially formed by the sensor element 20.1. The sensor element 20.1 is preferably of a cable-form and/or designed with an elongated extension in order to provide a sensing region as elongated as possible for sensing an activating action. It is also conceivable that the sensor element 20.1 comprises an extension deviating from an elongated extension, e.g. essentially a circular form or rectangular form or dot form or the like. The activating action is, for example, the movement of an activating means 9, such as a body part 9, in particular a foot 9, of a user 8 in a vicinity outside the vehicle 1 or the sensor element 20.1. To perform the activating action, one possibility is that the user 8 moves the activating means 9 under the bumper 3. This movement is then sensed as a change in a sensor capacitance CS of the capacitive sensor device 20, and can preferably be evaluated and detected by a monitoring device 50 of the sensor device 20. The monitoring device 50 is electrically connected and/or connected to the sensor element 20.1. Accordingly, it can be useful if the monitoring device 50 is designed as a control apparatus of the vehicle 1, preferably as part of—or electrically connected to—the vehicle electronic system. In this case it is conceivable that in order to reduce the switching effort, only a single electrical connection, e.g. a single electrical line such as a cable, leads from the monitoring device 50 to the sensor element 20.1, i.e. the latter is only connected via a single electrically conductive connection. Thus, the sensor element 20 corresponds to a sensor electrode 20.1 for providing the sensor capacitance CS. It is also possible that the activating action is detected by the monitoring device 50, which then activates the vehicle function or at least one of the vehicle functions.

In FIG. 2, the sensing principle for the detection of the activating action and for the evaluation of the sensor capacitance CS is shown in more detail by means of a principle circuit diagram of the capacitive sensor device 20 and an arrangement 10 according to the invention, in particular a circuit arrangement 10. Only one or, if necessary, several sensor elements 20.1 may be provided. Two sensor elements 20.1 in the form of sensor electrodes 20.1, each of which can provide a sensor capacitance CS, are shown as examples in FIG. 2. In other words, a sensor element 20.1 or a sensor electrode 20.1 can each provide a capacitive sensor, which can be regarded as a capacitor. If several sensor elements 20.1 are used, at least one switching device 60 with at least one selective switch can be provided, which alternately selects the sensor elements 20.1, i.e. establishes an electrical connection to them. The at least one switching device 60 connects the sensor elements 20.1 alternately e.g. with a pre-filter arrangement 80 and/or at least one switching element S. The use of at least two sensor elements 20.1 has the advantage that e.g. movements and/or movement patterns can be sensed.

The respective sensor element 20.1 can comprise an electrically conductive material to form a (single) sensor electrode 20.1. To provide the sensor capacitance CS, it is sufficient if only the respective sensor electrode 20.1 is provided without counter-electrode. In this case the counter-electrodes shown in FIG. 2 (opposite to the respective sensor elements 20.1) are only representative to illustrate the principle and not to be considered as actual components.

Alternatively, at least one or, for each sensor element 20.1, an assigned counter-electrode may be structurally provided.

Each sensor element 20.1 can form the sensor capacitance CS with respect to a ground potential 20.2, in particular the vehicle mass, and the vicinity of the vehicle 1. The sensor capacitance CS can thus be changed by the vicinity of the vehicle 1, especially if an activating means 9 moves into the vicinity region of the sensor element 20.1. In this way, an activating action can be sensed very reliably using the sensor capacitance CS.

For the evaluation of the sensor capacitance CS, various methods can be considered. The methods are based in particular on the fact that a recharging of the charge contained in the sensor element 20.1 or stored by means of the sensor capacitance CS to a holding arrangement 50.4 with a holding capacitance CH is performed. The fact that the stored charge depends on the variable sensor capacitance CS and thus on the vicinity of the vehicle 1 (e.g. the activating action) is used. The holding arrangement 50.4 can comprise a holding capacitor which serves for charge accumulation and/or intermediate storage and evaluation of the charge by the monitoring device 50. It is advantageous for the holding arrangement 50.4 to comprise an operational amplifier OP', which, if necessary, forms an integrator with at least one further component and/or a feedback (possibly in the form of a phase- and/or frequency-dependent feedback (e.g. via a capacitor) (see also FIG. 6). The integrator serves to store a charge quantity specific to the charge quantity received by the sensor element 20.1 during recharging via a receiving signal. The operational amplifier OP' can be connected via an output O to a control device 50.1 e.g. in the form of a microcontroller, if necessary via an analogue-digital converter 50.2, in order to evaluate the stored charge quantity.

For recharging, it is advantageous to use a repeatedly performed receiving phase (also called recharging phase). The receiving phase can be a specific switching phase, i.e. a switching state of at least one switching element S. For this purpose, for example, the at least one switching element S, in particular at least one alteration switch S, is repeatedly switched over, preferably at a frequency of 333 kHz. In this case, the receiving phase is present when the switching element S electrically connects a receive path r with the sensor element 20.1. After a further switch of the switching element S to another switching state, however, there is a transmission phase (possibly also called charging phase) in which the switching element S electrically connects a transmit path t with the sensor element 20.1. Both paths r, t can be designed as lines (e.g. on a printed circuit board), which thus provide an electrically conductive connection.

The transmission phase can be used to supply the sensor element 20.1 with charge, i.e. to charge the capacitive sensor. For this purpose, for example, the sensor element 20.1 is electrically connected in the transmission phase via the switching element S and via the transmit path t to a transmission arrangement 30. This causes the transmission of an output signal A via the transmit path t, in particular from the transmission arrangement 30 to the sensor element 20.1. The receiving phase, on the other hand, can be used to receive from the sensor element 20.1 any charge present in it (stored due to the sensor capacitance CS), i.e. to effect the recharging. For this purpose, for example, the sensor element 20.1 is electrically connected in the receiving phase via the switching element S and via the receive path r to a holding arrangement 50.4. This causes the transmission of a receiving signal via the receive path r, in particular from the sensor element 20.1 to the holding arrangement 50.4. In addition, the switching device 60 can also be repeatedly switched over in order to alternately connect the different sensor elements 20.1 with the receive and transmit path r,t.

In the following, the receiving phase is examined in more detail, which can be used for evaluation with the sensor device 20. In the receiving phase the charge stored by means of the sensor capacitance CS can be 'recharged', i.e. depending (e.g. proportionally) on the sensor capacitance CS or the charge stored thereby the holding arrangement 50.4 can be charged with the holding capacitance CH (e.g. of a holding capacitor). The recharging can take place via a low-pass filter 50.5 and/or via a current mirror that is not explicitly shown. The state of charge of the holding arrangement 50.4 or the holding capacitor, which is then relevant for the detection of the activating action, can be determined in particular by means of a voltage across or serially to the holding capacitor, optionally via the analogue-digital converter 50.2. For this purpose the analogue-digital converter 50.2 can be connected on the one hand to the holding arrangement 50.4 via a low-pass filter 50.5 and on the other hand to the control device 50.1. In addition, optionally at least one further monitoring element 50.7 (also: compensator) can be connected to the receive path r, e.g. to compensate for a charge overflow during recharging. For this purpose the monitoring element 50.7 can, for example, comprise a regulation circuit. Thus, the monitoring element 50.7 (if necessary together with other elements such as the control device 50.1) can be designed to detect a charge overflow (i.e. if the recharged charge quantity can no longer be stored by the holding capacitance CH) and/or to perform compensation.

The control device 50.1 of the monitoring device 50 can be designed as a microcontroller or similar and, if necessary, also perform the (in particular repeated and/or clocked) switching of the switching element S. In particular, the control device 50.1 can perform this depending on at least one adjusting means 50.3, preferably a computer program, in order to determine and/or vary a phase duration of the receiving phase and/or the transmission phase. In addition, the control device 50.1 can also interrupt the alternate performance of the receiving phase and/or the transmission phase, i.e. introduce a further interruption phase. This is used, for example, to pause the output of an output signal A and/or the transmission of the receiving signal in order to reduce energy consumption, for example.

The principle circuit diagram according to FIG. 2 clarifies that, in particular by the described switching of the switching element S, a square wave signal is produced without further measures for the control and/or evaluation of the sensor element 20.1. This comprises a very broad frequency spectrum. Such an unfavourable frequency spectrum can, without further measures, lead to a disturbing electromagnetic radiation (emission) by the sensor element 20.1 into the vicinity of the vehicle 1, and especially in frequency ranges which can have disturbing effects on other radio signals or the like.

Therefore, as a measure within the scope of the invention, it may be provided that a phase-dependent and/or frequency-dependent transmission and/or change of at least one signal is performed for control and/or evaluation. Thus, for example, for control (i.e. for transmission to the sensor element 20.1 and/or for charging and/or operating the sensor element 20.1), a signal, namely the output signal A, can be output and/or generated directly at an output 30.2 of a transmission arrangement 30, wherein the width of the frequency spectrum of the signal, in particular the harmonics, and thus the interference effect can be reduced by signal forming and/or filtering. As a further signal for evaluation, the receiving signal from the sensor element 20.1 can also be influenced by the phase- and/or frequency-dependent transmission or change, e.g. by connecting the transmission arrangement 30 with the holding arrangement 50.4, in order to thereby control the reception of the receiving signal.

It is also advantageous if the signal and/or the signal forming is influenced by the control device 50.1 and/or by a control arrangement 50.6 connected to and/or integrated in the control device 50.1. These can be connected to an input 30.1 of the transmission arrangement 30 in order to provide an input signal E (in particular a control signal E) for the transmission arrangement 30 at the input 30.1. In this way, the transmission arrangement 30 can be connected between the control device 50.1 and the sensor element 20.1 in order to perform the frequency- and/or phase-dependent transmission or change in the input signal E. This takes place in particular as an advantageous frequency filtering so that the interfering frequencies in the input signal E are predominantly filtered out. For this purpose, the input signal E, if present at the input 30.1 of the transmission arrangement 30, can be filtered and output as the output signal A at the output 30.2. Depending on this transmitted/changed (especially filtered) input signal E, a guided output signal A can also be output by the transmission arrangement 30. This ensures that the form of the transmitted or changed or filtered signal—and thus the filtered frequency spectrum—is also retained at the sensor element 20.1. By the term "guided" it can be understood in particular that the output signal A is actively generated depending on the transmitted or changed or filtered input signal E and is applied to the sensor element 20.1, e.g. by using an operational amplifier OP.

As shown in FIG. 2 and, with further details, also in FIG. 6, the transmission arrangement 30 can also be connected to an input of the holding arrangement 50.4. In this case, the holding arrangement 50.4 comprises an integrator, for example. As an example, it may thus be provided that an input of the transmission arrangement 30, in particular a non-inverted input "+" of the operational amplifier OP of the transmission arrangement 30, is connected to an input of the integrator, preferably to a (non-inverted) input "+" of a further operational amplifier OP' of the integrator. This connection is preferably designed so that the holding arrangement 50.4 receives the receiving signal from the sensor element 20.1 via the receive path r, depending on the frequency- and/or phase-dependent transmission and/or change by the transmission arrangement 30. For this purpose, a signal provided by the transmission arrangement 30 (e.g. at the input "+" of the operational amplifier OP in FIGS. 3 and 6), which comprises the frequency- and/or phase-dependent change due to filtering, can influence e.g. the function of the holding arrangement 50.4 or the integrator. If the connection is made to the input of the integrator, this provided signal can be interpreted as a kind of reference for integration (e.g. by the connection to the non-inverted operational amplifier input of the integrator, the provided signal influences the differential voltage of this further operational amplifier OP' of the integrator and, if necessary, via a feedback at the operational amplifier OP', thus also the receiving signal). The connection of the components shown in FIG. 6 can correspond to those in FIGS. 2 and 3, as shown by the dotted connecting lines.

FIG. 3 shows the transmission arrangement 30 with further details. The circuit for generating the input signal E, i.e. in particular the monitoring device 50, preferably the control device 50.1 and/or the control arrangement 50.6, is represented schematically by an input signal source 40. This is capable of generating an electrical input signal E, such as at least one input signal E which is essentially designed as a square wave signal or is based on it. If necessary, the control arrangement 50.6 can also perform a further signal forming of the input signal E, e.g. via switchable resistors, in order to form the input signal E. For this purpose, the control arrangement 50.6 can also be controlled by the control device 50.1 to perform the signal forming, e.g. monitored by the adjusting means 50.3. The input 30.1 is electrically connected to at least a first filter component 30.4, in particular an RC element, and/or a second filter component 30.5, in particular further resistors R and/or capacitors C to form a Sallen Key filter. The first filter component 30.4 comprises e.g. a (possibly only) resistor R and a (possibly only) capacitor C. Preferably, by connecting the two filter components 30.4, 30.5 a filter of third order can be provided by the transmission arrangement 30. The use of an operational amplifier OP also allows the design as an active filter, preferably a Sallen Key filter.

In FIG. 2, the control device 50.1 is schematically connected to the control arrangement 50.6 via a line. This serves to simplify the circuit diagram, wherein the line can also be understood as several lines connecting the respective outputs of the control device 50.1 with the respective resistors of the control arrangement 50.6. Thus, for example, the control device 50.1 can be connected to the control arrangement 50.6 via at least one or two or three or four separate electrical lines, in particular to control at least one resistor of the control arrangement 50.6 via each of the lines. Furthermore, the lines can, for example, each connect one output of the control device 50.1 to at least one resistor of the control arrangement 50.6 and preferably connect the respective output electrically to the input 30.1 via the respective resistor(s). For example, the control arrangement 50.6 comprises at least two or three or four resistors, each of which is connected with a first terminal via a respective line to the control device 50.1 and with a second terminal to the input 30.1. Since these are different lines and outputs of the control device 50.1, the resistors can be controlled individually and/or independently of each other to provide the input signal E formed at the input 30.1. In other words, a programmable voltage divider is formed by the control arrangement 50.6. This allows the input signal E to be formed as described in more detail in relation to FIG. 5.

It can be seen that the filter components 30.4, 30.5 may be electrically connected to a source device 30.3, in particular a current and/or voltage source device 30.3. In the example shown in FIG. 3, the source device 30.3 is designed as the operational amplifier OP, which is connected to the filter components 30.4, 30.5 in the sense of a Sallen Key Filter configuration. Accordingly, the operational amplifier OP and/or the source device 30.3 can also be understood as an additional filter component. The source device 30.3 effects an output of an output signal A at the output 30.2 on the basis of the input signal E filtered by the filter components 30.4, 30.5. For active guidance of the output signal A the source device 30.3 is connected to a supply voltage. The following examples show a first voltage U1 for providing a first supply potential VE and a second voltage U2 for providing a second supply potential VC, wherein the voltages are e.g. of the same amount and different polarity. U1 for example is −5 V and U2 for example is +5 V. By appropriate design of the components, a transmission arrangement 30 can be provided which comprises the filter characteristics of an active low-pass filter, in particular of third order and/or with an attenuation of −20 dB at 1 MHz and/or a limiting frequency of 470 kHz. In other words, a harmonic suppression of at least −20 dB can be provided. The filter is particularly suitable for an operating frequency of the sensor device 20 of (essentially) 333 kHz, which is determined by the frequency of the switching between the receiving phases and/or transmission phases. For example, the operating frequency (or other operating frequencies) is determined by the switching frequency of the switching element S or corresponds to it. In particular, harmonics from the second harmonic or third harmonic onwards can be effectively suppressed.

Alternatively, if necessary, the filter components 30.4, 30.5 can be omitted, so that e.g. the transmission arrangement 30 only comprises the controlled source device 30 in order to transmit the input signal E essentially unchanged and then output it as the output signal A (e.g. as a square wave signal) without filtering. Furthermore, the transmission arrangement 30 may also comprise the filter characteristics of an all-pass filter or the like.

A further alternative and/or addition to the inventive arrangement 10 is shown in FIG. 3 in dotted lines. Here, a connection to a further source device 30.3' may be provided at the output 30.2, preferably at the operational amplifier OP and/or the source device 30.3 and/or the at least one filter component 30.4, 30.5, in order to provide an alternative output 30.2'. This design is only optional, for example to use a current source and/or a converter as a further source device 30.3' in order to provide an alternative output signal A'. This design with the further source device 30.3' can be used in addition to the design shown with the operational amplifier OP, or can also replace the source device 30.3'. In the latter case, the filter formed by the filter components 30.4, 30.5 can also be designed as a passive filter and/or the further source device 30.3' can also form a filter component to form an active filter. In principle, the output signal A or A' can therefore be a forcibly actuated sensor voltage or a forcibly actuated sensor current.

FIG. 4 shows the transmission distance of a signal S' between the switching element S and the at least one sensor element 20.1. Within this transmission distance along a transmission path u, further electronic elements may be arranged, which is indicated by a dotted line of the transmission path u. These further elements can e.g. cause a further filtering of the signal S'. Depending on the switching position (switching state), the switching element S connects this transmission distance with the receive path r for evaluation or the transmit path t for control. In a first switching position of the switching element S, the signal S' can thus correspond to the output signal A, which is transmitted from the output 30.2 of the transmission arrangement 30 to the sensor element 20.1. In a second switching position of the switching element S, however, the signal S' can correspond to a receiving signal and be transmitted to the holding arrangement 50.4 via the receive path r. In the latter case, the signal S is specific to the sensing and can be evaluated e.g. by the monitoring device 50 to detect an activating action.

As shown further in FIG. 4, a pre-filter arrangement 80, in particular a pre-selector 80, preferably in the form of a suction circuit and/or a band-pass filter or a band-stop filter (band-stop), can be used. In this way, interfering frequencies of the signal S' can be filtered out, which may be caused by the sensor element 20.1 (in the sense of irradiation or immission). It is clear from this that the sensor element 20.1 can also be regarded as a kind of antenna through which emissions (from the sensor device 20 into the vicinity of the vehicle 1) can escape and immissions (from the vicinity into the sensor device 20) can enter. The terms emissions and immissions are used here to refer to interfering radio signals or electromagnetic radiation. The pre-filter arrangement 80 can, for example, be designed as an LC resonant circuit and/or suction circuit, e.g. with a capacitor C and a coil L connected in parallel. The pre-filter arrangement 80 is connected to a first and second terminal 80.1, 80.2 as an example. It is advantageous if the first terminal 80.1 connects the pre-filter arrangement 80 to a supply potential and/or the second terminal 80.2 connects the pre-filter arrangement 80 to a ground potential. This has the advantage that signal parts of the signal S' in the undesired frequency range can be guided, i.e. discharged, via at least one of these terminals. For this purpose, the pre-filter arrangement 80 becomes low impedance for this possibly undesired frequency range. For the desired frequency, however, the pre-filter arrangement 80 can become high impedance so that the signal S' for this frequency is not guided through the pre-filter arrangement 80 (the pre-filter arrangement 80 thus acts as a band-pass for the desired frequency in such a way that the pre-filter arrangement 80 does not discharge the desired frequency). In the ideal case, i.e. in an operation exclusively with a signal S' of the desired frequency, there is thus no loss due to this filtering. Accordingly, the power loss can be significantly reduced by this design. It is also possible that a resistor and/or a resistor arrangement for the pre-filter arrangement 80 is integrated in the receive path r and the transmit path t, wherein preferably the resistors and/or resistor arrangements are (essentially) designed to be (essentially) the same (with the same resistance value and/or the same size and/or the same impedance). The resistors and/or the resistor arrangements can be designed to adapt a transfer function of the pre-filter arrangement 80.

FIG. 5 shows various possibilities II. to V. for signal forming the input signal E (continuous line) and the resulting output signal A (dashed line). For clarification, representation I. is shown in which no frequency- and/or phase-dependent change and/or only a frequency- and/or phase-dependent transmission of the input signal E is effected by the transmission arrangement 30. In representation II, however, the input signal E is filtered by the transmission arrangement 30, i.e. in particular by the filter components. The filter components preferably provide an analogue low-pass filter which changes the rectangular form of the input signal E. In this way, a sinusoidal output signal A can be provided. Representation III. shows an example of an advanced signal forming in which, in addition to filtering by the filter components of the transmission arrangement 30, a modulation (in particular as a "loop") is also effected by the control device 50.1 and/or the control arrangement 50.6. The input signal E deviates from the original rectangular form and, due to the modulation, shows an amplitude of individual pulses rising and falling in time. This advanced signal forming can, for example, be effected directly when the input signal E is generated by the control device 50.1. A further development is shown in representation IV, where a further modulation is used in addition to the modulation according to III. Here the input signal E comprises a step form which can favour the filtering by the transmission arrangement 30. In other words, according to representation III, the control arrangement 50.6 and/or a control device 50.1 can be designed to perform the forming of the input signal E by generating a square wave signal with sequential pulses in time, wherein the pulse amplitudes of different pulses vary in time, preferably with an amplitude rising and falling again in time (in particular within a burst), wherein the pulse amplitude of individual pulses preferably remains (essentially) constant over the pulse width. In contrast, in representation IV, the pulse amplitude of individual pulses can also change over time within the pulse width, preferably in a step form. In this way, a sinusoidal output signal A can be generated particularly reliably.

A particularly advantageous example of an input signal E is shown in representation V. This signal can be obtained, for example, by signal forming, which is provided by the control device 50.1 and/or the control arrangement 50.6. For this purpose the control arrangement 50.6 is designed as a programmable voltage divider. The form shown comprises several successive rectangular pulses, which differ from each other in their pulse amplitude. For this purpose, a control signal can be output by the control device 50.1 for the control arrangement 50.6 via the different lines, which are each connected to at least one resistor of the control arrangement 50.6. This is designed, for example, in the form of a pulse width modulation or the like and differs for different lines. The resistances of the different lines are, for example, of different sizes. In this way, the input signal E can be generated very precisely with the desired form. Due to the symmetry of the form, in particular the similar rising and falling pulse sequence and/or the constant absolute value of the amplitude difference for different pulses, a particularly advantageous spectrum can be generated. In particular, the third harmonic in the spectrum of the input signal E can be eliminated (if necessary completely).

The above explanation of the embodiments describes the present invention exclusively in the context of examples. Of course, individual features of the embodiments can be freely combined with each other, provided that it is technically reasonable, without leaving the scope of the present invention.

LIST OF REFERENCE SIGNS

1 vehicle
2 tailgate
3 bumper
8 user
9 body part, activating means
10 arrangement, circuit arrangement
20 sensor device
20.1 sensor electrode, sensor element
20.2 mass potential
30 transmission arrangement
30.1 input
30.2 output
30.3 source device, current and/or voltage source device
30.4 first filter component, RC element for low-pass of first order
30.5 second filter component, further arrangement for low-pass of second order
40 input signal source, digital signal generation
50 monitoring device 50.1 control device, microcontroller
50.2 analogue-digital converter
50.3 adjusting means, software
50.4 holding arrangement
50.5 low-pass filter
50.6 control arrangement
50.7 further monitoring element
60 switching device
80 pre-filter arrangement, pre-selector
80.1 first terminal, supply terminal
80.2 second terminal, ground terminal
r receive path
t transmit path
A output signal
C capacitor
CH holding capacitance
CS sensor capacitance
E input signal
O output
OP operational amplifier
OP' further operational amplifier
L coil
R resistor
S switching element
U transmission path
U1 first voltage
U2 second voltage
VC supply voltage, second potential
VE supply voltage, first potential

The invention claimed is:

1. An arrangement for a capacitive sensor device of a vehicle comprising
at least one sensor electrode for sensing a change in a vicinity of the vehicle,
a transmission arrangement for at least a frequency- or phase-dependent transmission of an electrical input signal and an output of an output signal, and
an output of the transmission arrangement, which is electrically connected to the sensor electrode to output the output signal at the sensor electrode,
wherein the transmission arrangement comprises a controlled source device to generate the output signal depending on at least the frequency- or phase-dependent transmission of the input signal, and
wherein the output signal can be generated depending on at least the frequency-dependent or phase-dependent transmission of the input signal by the fact that the source device is connected to at least one filter component, so that the input signal, changed by the filter component, is applied to a control input of the source device in order to control the source device with regard to the output of the output signal, and an output of the source device is connected to or corresponds to the output of the transmission arrangement.

2. The arrangement according to claim 1,
wherein the source device is at least designed as a real low impedance controlled current or voltage source in order to output the generated output signal as a guided electrical signal at the sensor electrode.

3. The arrangement according to claim 1,
wherein the source device is designed as an active component, wherein the source device is directly connected to a supply voltage in order to actively generate the output signal.

4. The arrangement according to claim 1,
wherein the transmission arrangement comprises at least one filter component to form an electronic filter to perform at least the frequency-dependent or phase-dependent transmission of the input signal.

5. The arrangement according to claim 1,
wherein an input signal source is connected to an input of the transmission arrangement in order to provide the input signal at the input, wherein the input signal source comprises at least one control device for this purpose.

6. The arrangement according to claim 1,
wherein
the transmission arrangement is designed to perform a suppression of harmonics of the input signal in order to at least reduce an emission of signals in a disturbing frequency range by the sensor electrode.

7. The arrangement according to claim 1,
wherein
the source device is electrically connected to a vehicle electronic system in order to perform a switch-off of the source device so that the arrangement can be transferred to an energy-saving mode.

8. The arrangement according to claim 1,
wherein
an input signal source is designed to provide the input signal in such a way that the input signal is designed as a signal based on a square wave signal, which is actively changed in order to support at least the frequency- or phase-dependent transmission by the transmission arrangement.

9. The arrangement according to claim 1,
wherein
a monitoring device is provided which is electrically connected to the sensor electrode in order to evaluate the sensing of the change in the vicinity of the vehicle by the at least one sensor electrode by evaluating a variable capacitance of the sensor device by the monitoring device by means of the output signal.

10. The arrangement according to claim 1,
wherein
a monitoring device is provided in order to evaluate the sensing of the change in the vicinity of the vehicle by the at least one sensor electrode by charging a holding arrangement of the monitoring device depending on a variable capacitance of the sensor device in repeatedly performed recharging phases, so that a charge accumulation takes place at the holding arrangement in the recharging phases.

11. The arrangement according to claim 1,
wherein
the arrangement is adapted for integration into at least a door handle of the vehicle or into a rear region or a side region or a front region of the vehicle or into a bumper of the vehicle.

12. A sensor device for a vehicle, comprising:
an arrangement according to claim 1, and
a monitoring device which is electrically connected to the arrangement to provide an input signal for evaluating a variable capacitance of the sensor device for the arrangement, wherein the monitoring device is electrically connectable to a vehicle electronic system in order to activate a vehicle function depending on the evaluation.

13. An external door handle for a vehicle with an arrangement according to claim 1.

14. A method for operating a capacitive sensor device of a vehicle, wherein the capacitive sensor device comprises an arrangement according to claim 1 and the following steps are performed:

a) generating of an electrical input signal,
b) performing at least a frequency- or phase-dependent transmission of the electrical input signal, and
c) outputting an output signal in such a way that a guided electrical signal is output at a sensor electrode depending on at least the frequency- or phase-dependent transmission of the input signal.

15. An arrangement for a capacitive sensor device of a vehicle comprising
at least one sensor electrode for sensing a change in a vicinity of the vehicle,
a transmission arrangement for at least a frequency- or phase-dependent transmission of an electrical input signal and an output of an output signal, and
an output of the transmission arrangement, which is electrically connected to the sensor electrode to output the output signal at the sensor electrode,
wherein the transmission arrangement comprises a controlled source device to generate the output signal depending on at least the frequency- or phase-dependent transmission of the input signal, and
wherein the transmission arrangement comprises a first filter component and a second filter component, wherein the filter components are connected to one another in order to at least jointly perform at least the frequency-dependent or phase-dependent transmission of the input signal or to increase the filter order of the transmission arrangement.

16. An arrangement for a capacitive sensor device of a vehicle comprising
at least one sensor electrode for sensing a change in a vicinity of the vehicle,
a transmission arrangement for at least a frequency- or phase-dependent transmission of an electrical input signal and an output of an output signal, and
an output of the transmission arrangement, which is electrically connected to the sensor electrode to output the output signal at the sensor electrode,
wherein the transmission arrangement comprises a controlled source device to generate the output signal depending on at least the frequency- or phase-dependent transmission of the input signal, and
wherein
at least the transmission arrangement or the source device is connected to the sensor electrode in such a way that at least an electrical signal or a signal form of the signal directly at the sensor electrode corresponds at least to 80% of at least the output signal or the signal form of the output signal.

* * * * *